(12) United States Patent
Frech et al.

(10) Patent No.: US 9,891,256 B2
(45) Date of Patent: *Feb. 13, 2018

(54) DETERMINING THE CURRENT RETURN PATH INTEGRITY IN AN ELECTRIC DEVICE CONNECTED OR CONNECTABLE TO A FURTHER DEVICE

(71) Applicant: INTERNATIONAL BUSINESS MACHINES CORPORATION, Armonk, NY (US)

(72) Inventors: Roland Frech, Ostfildern (DE); Erich Klink, Schonaich (DE); Jurgen Saalmuller, Boblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/407,874

(22) Filed: Jan. 17, 2017

(65) Prior Publication Data

US 2017/0122993 A1 May 4, 2017

Related U.S. Application Data

(63) Continuation of application No. 15/088,258, filed on Apr. 1, 2016, now Pat. No. 9,581,631, which is a
(Continued)

(30) Foreign Application Priority Data

Jan. 17, 2007 (EP) ..................................... 07100678

(51) Int. Cl.
*G01R 27/28* (2006.01)
*G01R 31/08* (2006.01)
(Continued)

(52) U.S. Cl.
CPC ............. *G01R 27/28* (2013.01); *G01R 27/16* (2013.01); *G01R 31/025* (2013.01);
(Continued)

(58) Field of Classification Search
CPC ........ H04B 3/46; H04B 3/487; H05K 9/0069; G01R 31/001; G01R 31/021;
(Continued)

(56) References Cited

U.S. PATENT DOCUMENTS 4,620,282 A 10/1986 Shelley
5,513,188 A 4/1996 Parker et al.
(Continued)

FOREIGN PATENT DOCUMENTS

EP 2065312 6/1981
EP 0675607 10/1995
(Continued)

OTHER PUBLICATIONS

International Search Report for PCT/EP2007/062542, dated Apr. 22, 2008, pp. 1-12.
(Continued)

*Primary Examiner* — Hoai-An D Nguyen
(74) *Attorney, Agent, or Firm* — Steven Chiu; Matthew M. Hulihan; Heslin Rothenberg Farley & Mesiti P.C.

(57) ABSTRACT

A method for determining current return path integrity in an electric device with a plurality of signal lines and supply lines. A library with at least one reference signal pattern of a near end crosstalk signal on a defined signal line arising from an input signal on another defined signal line is provided, a predetermined signal to a selected signal line of the electric device is applied, the near end crosstalk signal on at least one further signal line of the electric device is detected, said near end crosstalk signal is compared with the corresponding reference signal pattern from the library, and
(Continued)

if there is a deviation between the near end crosstalk signal and the corresponding reference signal pattern, an information that there is any defect in the electric device is displayed.

17 Claims, 2 Drawing Sheets

Related U.S. Application Data continuation of application No. 14/796,595, filed on Jul. 10, 2015, now Pat. No. 9,304,158, which is a continuation of application No. 13/565,159, filed on Aug. 2, 2012, now Pat. No. 9,134,364, which is a continuation of application No. 12/523,119, filed as application No. PCT/EP2007/062542 on Nov. 20, 2007, now Pat. No. 8,248,082.

(51) Int. Cl.
  *G01R 27/16* (2006.01)
  *G01R 31/02* (2006.01)
  *G01R 31/28* (2006.01)
  *G01R 31/3185* (2006.01)
  *H04B 3/487* (2015.01)
  *G01R 31/04* (2006.01)

(52) U.S. Cl.
  CPC ....... *G01R 31/046* (2013.01); *G01R 31/2839* (2013.01); *G01R 31/31855* (2013.01); *H04B 3/487* (2015.01)

(58) Field of Classification Search
  CPC .. G01R 31/025; G01R 31/08; G01R 31/0835; G01R 31/2839; G01R 31/31855; G01R 29/0835; G01R 27/16
  USPC ....... 324/600, 612, 627, 628, 522, 523, 525, 324/527, 555, 713, 718; 702/65
  See application file for complete search history.

(56) References Cited

U.S. PATENT DOCUMENTS

| 6,650,238 | B1 | 11/2003 | Britton |
| 8,248,082 | B2 | 8/2012 | Frech et al. |
| 9,134,364 | B2 | 9/2015 | Frech et al. |
| 9,304,158 | B2 | 4/2016 | Frech et al. |
| 9,581,631 | B2* | 2/2017 | Frech ................... G01R 31/025 |
| 2003/0182640 | A1 | 9/2003 | Alani et al. |
| 2006/0190872 | A1 | 8/2006 | Cress |
| 2006/0217001 | A1 | 9/2006 | Bolouri-Saransar et al. |
| 2008/0150544 | A1 | 6/2008 | Premerlani et al. |
| 2010/0109679 | A1 | 5/2010 | Frech et al. |

FOREIGN PATENT DOCUMENTS

| EP | 0822671 | 2/1998 |
| JP | H0348179 | 3/1991 |
| JP | H06194401 | 7/1994 |
| JP | H07141079 | 6/1995 |
| JP | H09189739 | 7/1997 |
| JP | H1090337 | 4/1998 |
| JP | 2000046886 | 2/2000 |
| JP | 2001027918 | 1/2001 |
| JP | 2003050256 | 2/2003 |
| JP | 2006518030 | 8/2006 |

OTHER PUBLICATIONS

Notification of Transmittal of the International Preliminary Report on Patentability for PCT/EP2007/062542, dated Jan. 15, 2009, pp. 1-13.

"TDR Primer—Application Note," Printed Circuit Design Magazine, Apr. 2002, pp. 1-8.

Office Action in U.S. Appl. No. 12/523,119, dated Dec. 22, 2011, pp. 1-9.

Notice of Allowance in U.S. Appl. No. 12/523,119, dated Apr. 10, 2012, pp. 1-9.

Notice of Allowance in U.S. Appl. No. 13/565,159, dated Mar. 4, 2015, pp. 1-10.

Notice of Allowance in U.S. Appl. No. 13/565,159, dated May 7, 2015, pp. 1-9.

Office Action in U.S. Appl. No. 14/796,595, dated Oct. 2, 2015, pp. 1-10.

Notice of Allowance in U.S. Appl. No. 14/796,595, dated Jan. 8, 2016, pp. 1-7.

Office Action in U.S. Appl. No. 15/088,258, dated Jul. 1, 2016, pp. 1-13.

Notice of Allowance in U.S. Appl. No. 15/088,258, dated Oct. 24, 2016, pp. 1-7.

* cited by examiner

DETERMINING THE CURRENT RETURN PATH INTEGRITY IN AN ELECTRIC DEVICE CONNECTED OR CONNECTABLE TO A FURTHER DEVICE

CROSS-REFERENCE TO RELATED APPLICATIONS

This application is a continuation of U.S. Ser. No. 15/088,258, entitled DETERMINING THE CURRENT RETURN PATH INTEGRITY IN AN ELECTRIC DEVICE CONNECTED OR CONNECTABLE TO A FURTHER DEVICE" filed on Apr. 1, 2016; which is a continuation of U.S. Ser. No. 14/796,595, filed on Jul. 10, 2015 and issued as U.S. Pat. No. 9,304,158 on Apr. 5, 2016; which is a continuation of U.S. Ser. No. 13/565,159, filed Aug. 2, 2012 and issued as U.S. Pat. No. 9,134,364 on Sep. 15, 2015; which is a continuation of U.S. Ser. No. 12/523,119, filed Jul. 14, 2009 and issued as U.S. Pat. No. 8,248,082 on Aug. 21, 2012; which is a U.S. National Phase Application of PCT/EP2007/062542, filed on Nov. 20, 2007 and published in English on Jul. 24, 2008 as WO 2008/086908 and claims priority of EP Application No. 07100678.7 filed on Jan. 17, 2007, each of which is hereby incorporated herein by reference in its entirety.

BACKGROUND

The present invention relates to a method for determining the current return path integrity in an electric device with a plurality of signal lines and supply lines, wherein said electric device is connected or connectable to a further device. In particular, the invention relates to a method for determining the current return path integrity in a connector receptacle with a plurality of signal lines and supply lines, wherein said receptacle is connected or connectable to a printed circuit board. Further the present invention relates to a test device for performing the above method.

An electric device with a plurality of signal lines and supply lines is usually connected to a further electric device. For example, said electric device may be a connector receptacle and said further electric device may be a printed circuit board. The connector receptacle is connected to the printed circuit board by a plurality of soldering joints. There are at least two types of supply lines, for example VDD lines and GND (ground) lines, where VDD stands for the positive supply voltage of an integrated circuit. If a circuit or device on the printed circuit board requires several voltages, then there are a corresponding number of different voltage lines. For example, an integrated circuit can require an additional negative voltage supply line VSS.

The supply lines, in particular the VDD and GND lines are provided for the power distribution in a printed circuit board. The supply lines of the same type are interconnected together and are therefore redundant supply lines. Each redundant supply line of the connector assembly is connected to a corresponding supply trace on the printed circuit board by a soldering joint. If there is an opening in said soldering joint, then the connection is maintained via the other supply lines of the same type. If a direct current is applied to the supply lines, then the single opening has no influence to the electric properties of the supply lines.

However, if an alternating current with a high frequency is applied to the supply lines or the signal lines, then the opening in the soldering joint causes a substantial change of the electric properties of the whole electric device. The supply lines, e.g. the VDD and GND lines are coupled capacitive and inductive to the signal lines. The supply lines are utilized as high frequency signal return paths. Losing one or more of those signal return paths causes additional impedance mismatches and an increased signal-to-signal coupling, which may be seriously impact high-speed system performance and reliability.

Therefore it is important to test high-speed signal paths after assembly as accurately as possible. In selected cases this can be done on a test bench. However, there is a serious problem, if an online assembly inspection of large connectors with more than 1000 signal connectors has to be done.

Known electric online testing methods allow the detection of signal shorts and openings as well as inter-power shorts. In the case of redundant VDD and GND connections it is very difficult to detect one or more openings by an AC (Alternating Current) and/or DC (Direct Current) resistance measurements. Additionally the location of the malicious signal return path opening has to be known to identify the affected signal traces.

Further an optical inspection, e.g. by X-ray, is manually possible in some cases. However, said optical inspection is very difficult and time consuming. The optical inspection also depends on human factors. Especially large and complex structured connector assemblies with thousands of signals require online testing methods during the manufacturing process.

There is no known method for an automatic testing to electrically localize redundant VDD and/or GND openings. Therefore the test coverage of high-speed links and interfaces is significantly exposed. This leads to data integrity and functionality problems during initial system test and thereby to increased hardware cost and system test delay.

BRIEF SUMMARY

It is an object of the present invention to provide an effective method for determining the current return path integrity in an electric device with a plurality of signal lines and supply lines. It is further an object of the present invention to provide a test device for performing said method.

The above object is achieved by a method as laid out in the independent claims. Further advantageous embodiments of the present invention are described in the dependent claims and are taught in the description below.

One idea of the invention is the use of the near end crosstalk signal to localize a defect in a redundant supply line, e.g. a redundant VDD or GND line. An input signal is applied to a signal line and the near end crosstalk signal on at least one neighboring signal line is detected. If there is an opening in a redundant supply line in the neighborhood of those signal lines, then there is a deviation between the actual near end crosstalk signal and a reference signal pattern.

The reference signal pattern has been taken from a library with reference signal patterns for a plurality of signal line pairs. The reference signal patterns have been determined on an efficient reference device of the same type, which has been positively tested before by another method.

The near cross talk signal is detected within a time window corresponding to the length of the tested signal lines in the electric device, in particular in the connector receptacle. Thus only defects in or on the connector receptacle are detected. The electric device may be tested independently of the properties of the further device. The connector receptacle may be tested independently of the properties of the printed circuit board.

The deviation between the actual near end crosstalk signal and the reference signal pattern indicates that there is a defect. The properties of said deviation indicate the kind and the localization of the defect. Return path openings cause increased near end crosstalk signals on the neighboring signal lines. The nature of the time domain of the near end crosstalk signal allows the precise determination of the coupling location.

The unplugged connector allows an access to each signal pin. The method may be performed automatically by a test device. The distance to the soldering joints on the printed circuit board to be checked is in the range of some 10 mm.

BRIEF DESCRIPTION OF THE SEVERAL VIEWS OF THE DRAWINGS

The above as well as additional objectives, features and advantages of the present invention become apparent in the following detailed written description.

The novel and inventive features believed to be the characteristics of the invention are set forth in the appended claims. The invention itself and its advantages are best understood by reference to the following detailed description of preferred embodiments in conjunction with the accompanied drawings, wherein:

DETAILED DESCRIPTION

Figure 1:
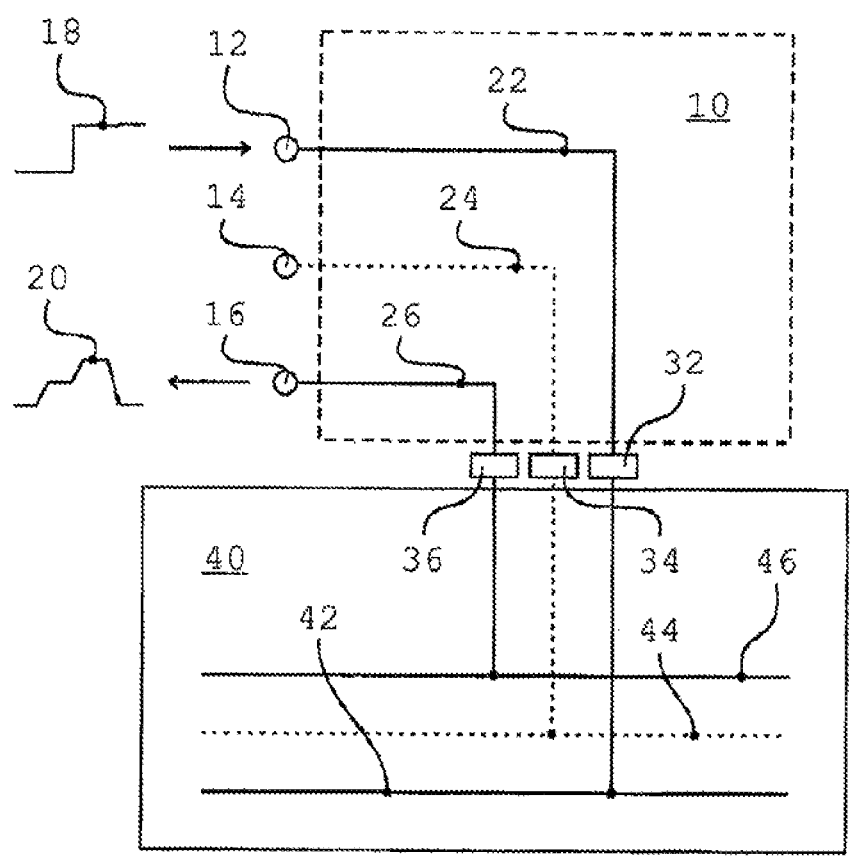
FIG. 1 illustrates a schematic diagram of a connector receptacle on a printed circuit board provided for a method according to a preferred embodiment of the present invention.

FIG. 1 illustrates a schematic diagram of a connector receptacle 10 on a printed circuit board 40. A method according to a preferred embodiment of the present invention may be applied to the connector receptacle 10 on the printed circuit board 40.

The connector receptacle 10 includes a plurality of pins. A first pin 12 and a second pin 16 as well as a redundant GND pin 14 are explicitly shown in FIG. 1. The first pin 12 and the second pin 16 are provided to couple the connector receptacle 10 to a cable or the like. The pins are arranged on the same side of the connector receptacle 10. Inside the connector receptacle 10 there is a plurality of signal and supply lines. A first signal line 22, a second signal line 26 and a GND line 24 are explicitly shown in FIG. 1. For example, the connector receptacle 10 is built up by a plurality of identical wafers.

The connector receptacle 10 is connected to the printed circuit board 40 via a plurality of soldering joints. A first soldering joint 32, a redundant GND soldering joint 34 and a second soldering joint 36 are explicitly shown in FIG. 1. The soldering joints 32, 34 and 36 may be provided as SMT (Surface-Mounting Technology) pads, for example. The first signal line 22 connects the first pin 12 to the first soldering joint 32. The second signal line 26 connects the second pin 16 to the second soldering joint 36. The GND signal line 24 connects the redundant GND pin 14 to the redundant GND soldering joint 34.

The printed circuit board 40 comprises a plurality of signal and supply traces. A first signal trace 42, a redundant GND trace 44 and a second signal trace 46 are explicitly shown in FIG. 1. The first signal trace 42, the redundant GND trace 44 and the second signal trace 46 may be provided as conductor paths, for example. The first signal trace 42 is connected to the first soldering joint 32. The redundant GND trace 44 is connected to the redundant GND soldering joint 34. The second signal trace 46 is connected to the second soldering joint 36.

The connector receptacle 10 may include a very large number of pins 12, 14 and 16. There are known connector assemblies with more than 1000 pins, for example. Thus the connector receptacle 10 includes also said large number of signal lines 22 and 26 and supply lines 24. Further the printed circuit board 40 comprises such a large number of soldering joints 32, 34 and 36, signal traces 42 and 46 and supply traces 44. The printed circuit board 40 may be a part of a high-end server, for example.

The method according to the present invention allows for checking of the quality of the signals transferred by the signal lines 22 and 26 in the connector receptacle 10. In particular, said method allows identifying any openings on the neighboring supply lines 24 within the connector receptacle 10 and on the soldering joint 34.

An input signal 18 is applied to the first pin 12 of the connector receptacle 10. The input signal 18 is provided as a voltage step, in particular a fast voltage step. The input signal 18 propagates from the first pin 12 through the connector receptacle 10 via the first signal line 22 to the first soldering joint 32. The first signal line 22 is coupled capacitive and inductively to the supply line 24 and to the second signal line 26. The coupling strength depends on the geometric relations between the signal lines 22 and 26 and the supply line 24.

The coupling of the signal lines 22 and 26 and the supply line 24 result in far end crosstalk signals and near end crosstalk signals. The far end crosstalk signal is the superposition of all partial coupling contributions along the signal paths. The pattern of the far end crosstalk signal always consists of one single voltage peak. The size and the sign of said voltage peak depend on the inductive and capacitive coupling balance. The near end crosstalk signal contains those partial contributions timely separated. Thus the amount of each single partial coupling contribution can be separated and quantified. If there is an opening in the redundant GND line 24 or in the soldering joint 34, then the near end crosstalk signal is changed.

Separating the redundant GND line 24 and the redundant GND trace 44 by removing the solder joint 34 results in an opening in the redundant GND path. This opening causes a changed output signal 20. This output signal 20 is a near end crosstalk signal, which is at least partially higher than a corresponding reference signal pattern. For example, the output signal 20 increases from 1 mV to 3 mV due to the opening in the solder joint 34.

The output signal 20 is compared with a reference signal pattern of a reference output signal. The reference signal pattern has been detected with an efficient reference device, i.e. a connector receptacle of the same type. The reference device has been tested before by another method. The reference signal patterns of said reference device has been stored in a library.

Each deviation between the output signal 20 and the reference output signal corresponds with an opening in a neighboring signal path. In one preferred embodiment the input signal 18, the output signal 20 and the reference output signal are the corresponding voltages as a function of the time.

Figure 2:
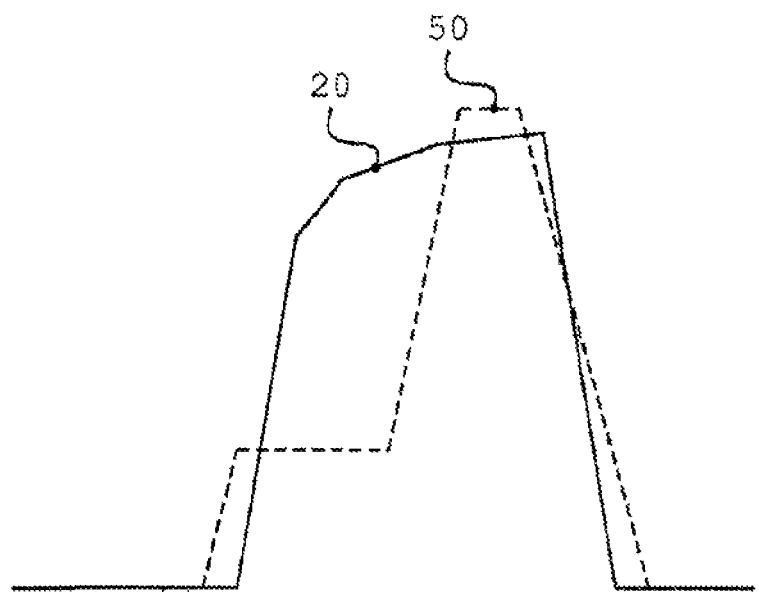
FIG. 2 illustrates schematically an output signal detected by a method according to a preferred embodiment of the present invention and compared by a reference signal pattern.

FIG. 2 illustrates schematically the output signal 20 and a reference signal pattern 50 from a method according to a preferred embodiment of the present invention. The output signal 20 as well as the reference signal pattern 50 shows the voltage as a function of the time. For example, the output signal 20 and the reference signal pattern 50 are represented by numerical values. The voltages and the corresponding times may be ordered as pairs in a table.

The time window has typically a width of about some 100 ps. The length of the signal lines 22 and 26 are known. Further the propagation velocity of the signals 18 and 20 are also known. With this information the opening in the GND line 24 may be localized by the time at which the deviation between the output signal 20 and the reference signal pattern 50 occurs.

Since the time window of the output signal 20 is limited to a predetermined range of time, which corresponds with the length of the signal lines 22 and 26, the connector receptacle 10 may be tested independent of the electric properties of the printed circuit board 40 or any further electric device coupled to said connector receptacle 10. Within this time window only such deviations may be detected, which occur from an opening in a supply line 26 in the neighborhood of the signal lines 22 and 26.

Due to the direct relationship between time and frequency domain all said analysis of signal 20 and comparison to reference signal 50 can also be applied in the frequency domain. The relationship between time and frequency domain is illustrated by Fourier transformation, for example.

A controllable test device is provided for performing the method according to the present invention. The test device allows an automatic execution of the above method. The test device comprises a test head, which may be connected to the connector receptacle 10. The test head sequentially moves along all pins 12, 14 and 16 of the connector receptacle 10. The test device initiates one or more voltage steps 18 on each pin 12, 14 and 16 and records the resulting near end crosstalk signals of the next neighboring lines.

Such a test device has a resolution of about 100 µV. If the deviation between the output signal 20 and the reference output signal is greater than a predetermined value, then the test device displays that the test was not successful. If the deviation between the output signal 20 and the reference output signal is smaller than said predetermined value, then the test device displays that the test was successful. For example, these results may be displayed by a red and green LED, respectively.

A simple prototype implementation of the test device uses a Tektronix CSA 8000 communication signal analyzer device. The CSA 8000 allows using a TDR (Time Domain Reflectometry) test head. This TDR test head is controlled by a robot arm device. A PC (Personal Computer) controls the CSA 8000 and the robot arm. The library of reference signal patterns is maintained by a computer program executed on the PC, which is performing a method in accordance with the present invention. The computer program displays the test results on a computer monitor connected to the PC.

In manufacturing lines specially designed industry robots could be used instead. In order to reduce the test time, the testing can be parallelized by using multiple test heads. For example, industry robots can have multiple robot arms in order to control multiple test heads at once.

A modification of the inventive method would be this method with an extended time window in order to detect openings on the printed circuit board 40 or on another electric device coupled to the connector receptacle 10.

Further, the inventive method may be provided for performing a simulation of the behavior of the electric crosstalk signal.

The inventive method can be combined with other testing methods. In particular, the inventive method may be combined with a de-embedding method. This allows the test of assemblies with long wires. A de-embedding method is described in the "TDR Primer", application note published in Printed Circuit Design Magazine, April 2002. This application note contains several further references to publications on de-embedding methods.

The method according to the present invention may be used to test cable connections. Further the inventive method may be used to test the conductor paths and/or the other connections on printed circuit boards.

Moreover the inventive method may be used to test arbitrary soldering joints. Especially soldering joint in the range of some µm can be tested.

In general, the inventive method can be used to test the quality of signals in arbitrary electric devices with several lines.

The present invention can also be embedded in a computer program product, which comprises all the features enabling the implementation of the methods described herein. Further, when loaded in a computer system, said computer program product is able to carry out these methods.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

LIST OF REFERENCE NUMERALS 10 connector receptacle
12 first pin
14 redundant GND pin
16 second pin
18 input signal
20 output signal, near end crosstalk signal
22 first signal line
24 redundant GND line
26 second signal line
32 first soldering joint
34 redundant GND soldering joint
36 second soldering joint
40 printed circuit board
42 first signal trace
44 redundant GND trace
46 second signal trace
50 reference signal pattern

What is claimed is:

1. A method for determining a current return path integrity in an electric device, the method comprising:
applying a signal to a selected signal line of a plurality of signal lines of the electric device;
detecting a crosstalk signal on at least one other signal line of the plurality of signal lines of the electric device;
comparing the detected crosstalk signal with a reference signal pattern; and
identifying whether a deviation between the detected crosstalk signal and the reference signal pattern exists, wherein the identifying identifies that a deviation between the detected crosstalk signal and the reference signal pattern exists, indicating that there is at least one open in the electric device, and wherein the method further comprises, based on identifying that the deviation exists, providing an indication that there is at least one open in the electric device.

2. The method of claim 1, wherein the signal is provided as a voltage step.

3. The method of claim 1, wherein the crosstalk signal is a near end crosstalk signal.

4. The method of claim 1, wherein providing the indication that there is at least one open is based further on the identified deviation between the crosstalk signal and the corresponding reference signal pattern being greater than a predetermined value.

5. The method of claim 1, wherein the open is localized on the basis of the time at which the deviation between the crosstalk signal and the corresponding reference signal pattern occurs.

6. The method of claim 1, wherein the method further comprises, based on identifying that the deviation exists, providing an indication that there is at least one open in the interconnected group of supply lines.

7. The method of claim 1, wherein the method further comprises obtaining the reference signal pattern from a library of reference signal patterns.

8. The method of claim 1, wherein the method further comprises repeating, for each additional signal line of one or more additional signal lines of the plurality of signal lines, the applying, the detecting, the comparing, and the identifying.

9. The method of claim 1, wherein the detecting comprises detecting the crosstalk signal within a time window that is adapted to a length of the selected signal line and a propagation velocity of the signal applied to the selected signal line.

10. A computer program product for determining a current return path integrity in an electric device, the computer program product comprising:
a storage medium readable by a computer and storing instructions for execution by the computer for performing a method comprising:
applying a signal to a selected signal line of a plurality of signal lines of the electric device;
detecting a crosstalk signal on at least one other signal line of the plurality of signal lines of the electric device;
comparing the detected crosstalk signal with a reference signal pattern; and
identifying whether a deviation between the detected crosstalk signal and the reference signal pattern exists, wherein the identifying identifies that a deviation between the detected crosstalk signal and the reference signal pattern exists, indicating that there is at least one open in the electric device, and wherein the method further comprises, based on identifying that the deviation exists, providing an indication that there is at least one open in the electric device.

11. The computer program product of claim 10, wherein the open is localized on the basis of the time at which the deviation between the crosstalk signal and the corresponding reference signal pattern occurs.

12. The computer program product of claim 10, wherein the signal is provided as a voltage step.

13. The computer program product of claim 10, wherein the crosstalk signal is a near end crosstalk signal.

14. The computer program product of claim 10, wherein the selected signal line is a signal line of a group of signal lines of the plurality of signal lines of the electric device, the group of signal lines electrically interconnected together to form an interconnected group of supply lines.

15. A test device comprising:
a test head connected or connectable to an electric device, the test device to perform a method comprising:
applying a signal to a selected signal line of a plurality of signal lines of the electric device;
detecting a crosstalk signal on at least one other signal line of the plurality of signal lines of the electric device;
comparing the detected crosstalk signal with a reference signal pattern; and
identifying whether a deviation between the detected crosstalk signal and the reference signal pattern exists, wherein the identifying identifies that a deviation between the detected crosstalk signal and the reference signal pattern exists, indicating that there is at least one open in the electric device, and wherein the method further comprises, based on identifying that the deviation exists, providing an indication that there is at least one open in the electric device.

16. The test device of claim 15, wherein the signal is provided as a voltage step.

17. The test device of claim 15, wherein the crosstalk signal is a near end crosstalk signal.

* * * * *